(12) United States Patent
Chen et al.

(10) Patent No.: US 9,134,361 B2
(45) Date of Patent: Sep. 15, 2015

(54) METHOD FOR DETERMINING BSIMSOI4 DC MODEL PARAMETERS

(75) Inventors: Jing Chen, Shanghai (CN); Qingqing Wu, Shanghai (CN); Jiexin Luo, Shanghai (CN); Zhan Chai, Shanghai (CN); Xi Wang, Shanghai (CN)

(73) Assignee: SHANGHAI INSTITUTE OF MICROSYSTEM AND INFORMATION TECHNOLOGY, CHINESE ACADEMY OF SCIENCES, Changning District Shanghai (CN)

( * ) Notice: Subject to any disclaimer, the term of this patent is extended or adjusted under 35 U.S.C. 154(b) by 373 days.

(21) Appl. No.: 13/696,455

(22) PCT Filed: Sep. 25, 2011

(86) PCT No.: PCT/CN2011/080145
§ 371 (c)(1),
(2), (4) Date: Nov. 6, 2012

(87) PCT Pub. No.: WO2012/051899
PCT Pub. Date: Apr. 26, 2012

(65) Prior Publication Data
US 2013/0054210 A1 Feb. 28, 2013

(30) Foreign Application Priority Data
Oct. 21, 2010 (CN) .......................... 2010 1 0515128

(51) Int. Cl.
*G06F 7/60* (2006.01)
*G01R 31/26* (2014.01)
*G06F 17/50* (2006.01)

(52) U.S. Cl.
CPC ........ *G01R 31/2628* (2013.01); *G01R 31/2603* (2013.01); *G06F 17/5036* (2013.01)

(58) Field of Classification Search
CPC .................................................. G06F 17/5036
See application file for complete search history.

(56) References Cited

U.S. PATENT DOCUMENTS 6,423,604 B1 * 7/2002 Long et al. ................... 438/311
7,655,944 B1 * 2/2010 Darwish ........................ 257/48
(Continued)

OTHER PUBLICATIONS

BSIMSOIv4.4 MOSFET Model Users' Manual BSIM Group Dec. 2010, pp. 1-128.*

(Continued)

*Primary Examiner* — Akash Saxena
(74) *Attorney, Agent, or Firm* — Tianhua Gu; Global IP Sevice

(57) ABSTRACT

The present invention provides a method for determining BSIMSOI4 Direct Current (DC) model parameters, where a plurality of Metal Oxide Semiconductor Field Effect Transistor (MOSFET) devices of a body leading-out structure and of different sizes, and a plurality of MOSFET devices of a floating structure and of different sizes are provided; Id-Vg-Vp, Id/Ip-Vd-Vg, Ig-Vg-Vd, Ig-Vp, Ip-Vg-vd, Is/Id-Vp, and Id/Ip-Vp-Vd properties of all the MOSFET devices of a body leading-out structure, and Id-Vg-Vp, Id-Vd-Vg, and Ig-Vg-Vd properties of all the MOSFET devices of a floating structure are measured; electrical property curves without a self-heating effect of each MOSFET device of a body leading-out structure and each MOSFET device of a floating structure are obtained; and then DC parameters of a BSIMSOI4 model are successively extracted according to specific steps. In the present invention, proper test curves are successively selected according to model equations, and various kinds of parameters are successively determined, thereby accurately and effectively extracting the DC parameters of the BSIMSOI4 model.

6 Claims, 3 Drawing Sheets

(56) References Cited

U.S. PATENT DOCUMENTS

| | | | |
|---|---|---|---|
| 2002/0158276 A1* | 10/2002 | Masleid | 257/288 |
| 2003/0055613 A1* | 3/2003 | Tsai | 703/2 |
| 2005/0027501 A1* | 2/2005 | Chen et al. | 703/14 |
| 2006/0107241 A1* | 5/2006 | Tanabe | 716/4 |
| 2006/0190863 A1* | 8/2006 | Axelrad et al. | 716/4 |
| 2009/0102501 A1* | 4/2009 | Guldi et al. | 324/765 |
| 2009/0249263 A1* | 10/2009 | Arimoto | 716/2 |
| 2011/0040548 A1* | 2/2011 | Khalily et al. | 703/14 |
| 2011/0184708 A1* | 7/2011 | Miura-Mattausch et al. | 703/2 |
| 2012/0059613 A1* | 3/2012 | Utter et al. | 703/2 |
| 2013/0054209 A1* | 2/2013 | Chen et al. | 703/2 |

OTHER PUBLICATIONS

Efficient Characterization Methodology of Gate-Bulk Leakage and Capacitance for Ultra-Thin Oxide Partially-Depleted (PD) SOI Floating Body CMOS by David Chen et a; IEEE 2009; pp. 133-136.*
BSIMPD: A Partial-Depletion SO1 MOSFET Model for Deep-Submicron CMOS Designs by Pin Su et al; IEEE 2000; pp. 197-200.*
Parameter Extraction for BSIMSOI4.3 MOSFET Model by Mrs.M. Muthulakshmi et al, International Journal of Scientific & Engineering Research, vol. 3, Issue 5, May 2012 1 ISSN 2229-5518 pp. 1-5.*
Effective width modeling for body-contacted devices in Silicon-On-Insulator Technology; NSTI-Nanotech 2009, www.nsti.org, ISBN 978-1-4398-1784-1 vol. 3, 2009, pp. 562-565.*

\* cited by examiner

METHOD FOR DETERMINING BSIMSOI4 DC MODEL PARAMETERS

CROSS REFERENCE TO RELATED PATENT APPLICATION

The present application is the US national stage of PCT/CN2011/080145 filed on Sep. 25, 2011, which claims the priority of the Chinese patent application No. 201010515128.3 filed on Oct. 21, 2010, which application is incorporated herein by reference.

BACKGROUND OF THE PRESENT INVENTION

1. Field of Invention

The present invention relates to a method for determining model parameters of a Silicon On Insulator (SOI) Metal Oxide Semiconductor Field Effect Transistor (MOSFET) device, and particularly to a method for determining BSIMSOI4 Direct Current (DC) model parameters, belonging to the field of micro-electronic device modeling.

2. Description of Related Arts

An MOSFET is a four-port semiconductor device, where different excitation is applied to each port, and a drain current of the device also changes accordingly. An input/output mathematical expression is obtained by establishing a mathematical model of the device, and circuit designers use the model to perform SPICE emulation of circuit design. Currently, multiple kinds of mathematical models with respect to the MOSFET are proposed, and each kind of model includes a large number of parameters. A BSIM model is a standard of a device model, and is widely used by semiconductor manufacturers.

Due to a complicated physical mechanism in the SOI MOSFET device, the SOI MOSFET device has a more complicated model equation and more model parameters than a bulk silicon device. For a device of a floating structure, since a body area is not connected to the outside and is in an electrical "floating" state, when the device actually works, various current components (a junction current, a parasitic triode current, a gate-to-body current, and a gate-induced drain leakage current) flowing into the body area results in charge accumulation and a non-constant potential in the body area, further causing a Kink effect and a GIFBE effect. In addition, since a bottom portion of the SOI MOSFET device has a layer of low-thermal conductivity Buried Oxide (BOX) layer, during a DC test, there is no time to reduce the temperature, enabling the channel temperature to be higher than the environment temperature, that is, a "self-heating effect" occurs. However, in an actual digital circuit application, the device works in a rapid turn-on/off state, there is no time to accumulate heat, so the "self-heating effect" is not obvious or disappears.

An accurate device model is a reliable guarantee of circuit emulation. Only after all parameters related to the body area and the self-heating effect are accurately extracted, a success rate of Integrated Circuit (IC) design based on an SOI process can be improved. A BSIMSOI4 model system includes abundant model equations of a junction current, a parasitic triode, and the like, and can effectively describe the foregoing effects. BSIMSOI4 has tens of parameters for describing unique SOI properties. Special test conditions need to be set, so as to obtain accurate parameters. Compared with other solutions, the present invention provides a more accurate and more effective method for extracting BSIMSOI4 model DC parameters.

SUMMARY OF THE PRESENT INVENTION

A technical problem to be solved by the present invention is to provide a method for determining BSIMSOI4 DC model parameters.

In order to solve the foregoing technical problem, the present invention adopts the following technical solutions.

A method for determining BSIMSOI4 DC model parameters comprises the following steps:

(1) providing a plurality of MOSFET devices of a body leading-out structure and with different channel lengths L and different channel widths W; and providing a plurality of MOSFET devices of a floating structure and with different channel lengths L and different channel widths W, wherein $0.85L_{min} \leq W \leq 1$ μm, $0.85L_{min} \leq L \leq 1$ μm, and $W_{min}$ and $L_{min}$ are minimum values determined by a process;

(2) measuring electrical property data of all the devices in different temperatures by using a semiconductor parameter measurement instrument, wherein the measured electrical properties of the MOSFET devices of a body leading-out structure comprise: Id-Vg-Vp, Id/Ip-Vd-Vg, Ig-Vg-Vd, Ig-Vp, Ip-Vg-Vd, Is/Id-Vp, and Id/Ip-Vp-Vd properties; and the measured electrical properties of the MOSFET devices of a floating structure comprise: Id-Vg-Vp, Id-Vd-Vg, and Ig-Vg-Vd properties;

(3) measuring heat resistance parameters Rth of all the MOSFET devices of a body leading-out structure and all the MOSFET devices of a floating structure; and obtaining, according to the electrical property data measured in step (2), electrical property curves without a self-heating effect of each MOSFET device of a body leading-out structure and each MOSFET device of a floating structure, wherein the electrical property curves without a self-heating effect of the MOSFET device of a body leading-out structure comprise: Id-Vg-Vp, Id/Ip-Vd-Vg, Ig-Vg-Vd, Ig-Vp, Ip-Vg-Vd, Is/Id-Vp, and Id/Ip-Vp-Vd curves, and the electrical property curves without a self-heating effect of the MOSFET device of a floating structure comprise Id-Vg-Vp, Id-Vd-Vg, and Ig-Vg-Vd curves;

(4) extracting, successively according to the following sub-steps, DC parameters of the MOSFET devices of a body leading-out structure and DC parameters of the MOSFET devices of a floating structure in a BSIMSOI4 model:

(a) in the bias voltage condition of Vg=0.5 Vgg, Vd=0.1 V, and Vp=0 V, and with W=1 μm and L=$L_{min}$, calculating an Id ratio of the MOSFET device of a body leading-out structure to the MOSFET device of a floating structure, recording the Id ratio as ratio, and extracting a parameter dwc=(1-ratio)/nbc, wherein nbc is a layout parameter of the device;

(b) according to the electrical property data of the MOSFET device of a body leading-out structure with W=1 μm and L=1 μm, extracting parameters related to a body effect of the MOSFET device of a body leading-out structure in the BSIMSOI4 model;

(c) according to an Is/Id-Vp curve of the MOSFET device of a body leading-out structure with W=1 μm and L=1 μm, extracting parameters related to a source body junction and a drain body junction of the MOSFET device of a body leading-out structure in the BSIMSOI4 model;

(d) according to an Ip/Id-Vp-Vd curve of the MOSFET device of a body leading-out structure with W=1 μm and L=1 μm, extracting parameters related to a parasitic triode of the MOSFET device of a body leading-out structure in the BSIMSOI4 model; optimizing, by adjusting a parameter ln, fitting effects of Ip/Id-Vp-Vd curves of all the MOSFET devices of a body leading-out structure with W=1 μm, so as to determine the parameter ln of the MOSFET device of a body leading-out structure;

(e) according to an Ig-Vp curve and an Ip-Vg curve of the MOSFET device of a body leading-out structure with W=1 μm and L=1 μm, extracting parameters related to a gate-to-body current of the MOSFET device of a body leading-out structure in the BSIMSOI4 model;

(f) according to an Ip-Vg-Vd curve of the MOSFET device of a body leading-out structure with W=1 μm and L=1 μm, extracting parameters related to a gate-induced drain leakage current of the MOSFET device of a body leading-out structure in the BSIMSOI4 model;

(g) according to the electrical property data of the MOSFET devices of a body leading-out structure and of all sizes, extracting parameters related to a drain current Id and a gate current Ig of the MOSFET devices of a body leading-out structure in the BSIMSOI4 model;

(h) according to an Ip-Vg-Vd curve and an Ip-Vd-Vg curve of the MOSFET device of a body leading-out structure with W=1 μm and L=1 μm, extracting parameters related to a collision ionization current of the MOSFET device of a body leading-out structure in the BSIMSOI4 model; optimizing, by adjusting parameters 1ii and esatii, fitting effects of Ip-Vg-Vd curves and Ip-Vd-Vg curves of all the MOSFET devices of a body leading-out structure with W=1 μm, so as to determine the parameters 1ii and esatii of the MOSFET device of a body leading-out structure;

(i) extracting temperature-related parameters related to a threshold voltage, mobility, a series resistance, saturation velocity, a junction current, a parasitic triode, and a collision ionization current of the MOSFET device of a body leading-out structure in the BSIMSOI4 model, so as to obtain all DC parameters of the MOSFET device of a body leading-out structure in the BSIMSOI4 model;

(j) first applying all the extracted DC parameters of the MOSFET device of a body leading-out structure to the MOSFET device model of a floating structure, then setting nbc, pdbcp, and psbcp to zero, keeping parameters related to a body bias voltage and parameters related to the gate-induced drain leakage current, the gate-to-body current, the junction current, and the parasitic triode unchanged, finely adjusting other DC parameters of the MOSFET device of a floating structure in the BSIMSOI4 model, and optimizing fitting effects of electrical property curves without a self-heating effect of the MOSFET device of a floating structure, so as to determine all DC parameters of the MOSFET device of a floating structure in the BSIMSOI4 model.

As a preferred solution of the present invention, in step (2), when the Id/Ip-Vd-Vg property of the MOSFET device of a body leading-out structure is measured, a value of a scanning voltage ranges from 0 V to 1.1 Vdd.

As a preferred solution of the present invention, in step (2), when the Ip-Vg-Vd property of the MOSFET device of a body leading-out structure is measured, a value of a scanning voltage ranges from −1 V to 1.1 Vgg, and a value of a variable voltage is 0 V, 0.9 Vdd, Vdd, or 1.1 Vdd.

As a preferred solution of the present invention, in step (2), when the Id/Ip-Vp-Vd property of the MOSFET device of a body leading-out structure is measured, a value of a scanning voltage ranges from 0 V to 0.7 V, and a value of a variable voltage is 0 V, 0.3 V, or Vdd.

As a preferred solution of the present invention, in step (2), the electrical property data of all the devices are measured in three different temperatures, and the three different temperatures are a normal temperature (25), a temperature (125) higher than the normal temperature, and a temperature (−40) lower than the normal temperature respectively.

Preferably, in the sub-steps (a) to (h) in step (4), the parameters are extracted by using test data in the normal temperature; in step (i), the parameters are extracted by using test data in the other two temperatures.

The beneficial effects of the present invention are as follows:

In the present invention, in the condition of different temperatures and different bias voltages, electrical performance of SOI MOSFET devices of various sizes, including MOSFET devices of a body leading-out structure and MOSFET devices of a floating structure, is tested, proper test curves are successively selected according to model equations, and various kinds of parameters are successively determined, thereby accurately and effectively extracting DC parameters of the BSIMSOI4 model.

In the present invention, a body area of the SOI MOSFET is independently and specifically modeled by using test data of the device of a body leading-out structure and the device of a floating structure, and model parameters are extracted based on a property curve without a self-heating effect, so as to conform to actual conditions of the devices. In addition, since the SOI MOSFET device model has a large number of parameters and the parameters are associated with one another, the model parameters determined in each step have a certain effect on the model parameters to be determined in a next step. In order that the finally determined parameters are more accurate, the inventor fully analyzes relationship among the parameters and relevance among actual device properties. When the model parameters are extracted, various kinds of important parameters are successively determined according to steps in a certain order and according to specific property curves, so that the extracted model parameters are more accurate, thereby ensuring accuracy of the emulation model.

An accurate SOI MOSFET device model facilitates the emulation of SOI circuit design, thereby having significant meanings for the development of the SOI circuit.

DETAILED DESCRIPTION OF THE PREFERRED EMBODIMENTS

A device structure of the present invention is further described in the following with reference to the accompanying drawings, and the accompanying drawings are not drawn to scale for ease of showing.

Figure 4:
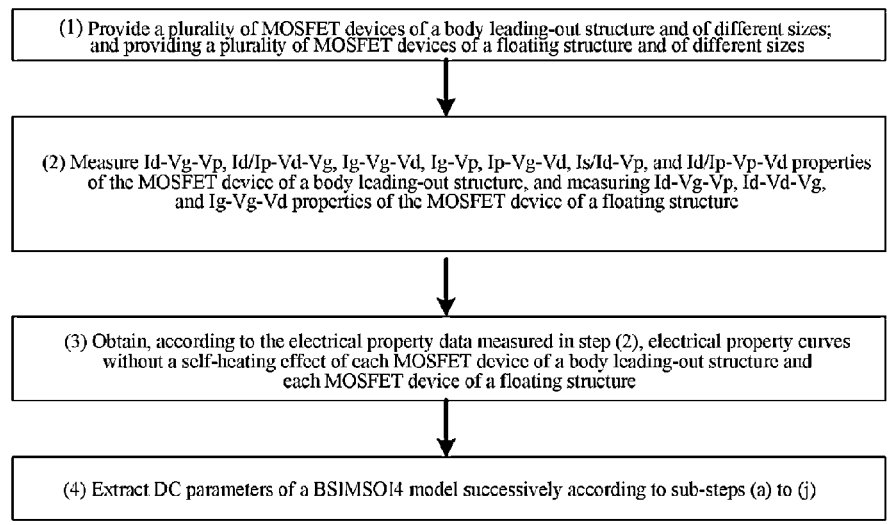
FIG. 4 is a schematic flowchart of extraction involved in the present invention according to an embodiment.

In this embodiment, taking an SOI MOSFET device model fabricated in a 0.13 μm fabrication process (a designed value of a minimum channel width among the MOSFET devices is 0.13 μm) as an example, a method for determining BSIM-SOI4 DC model parameters is provided. Referring to FIG. 4, the method includes the following steps.

Figure 1:
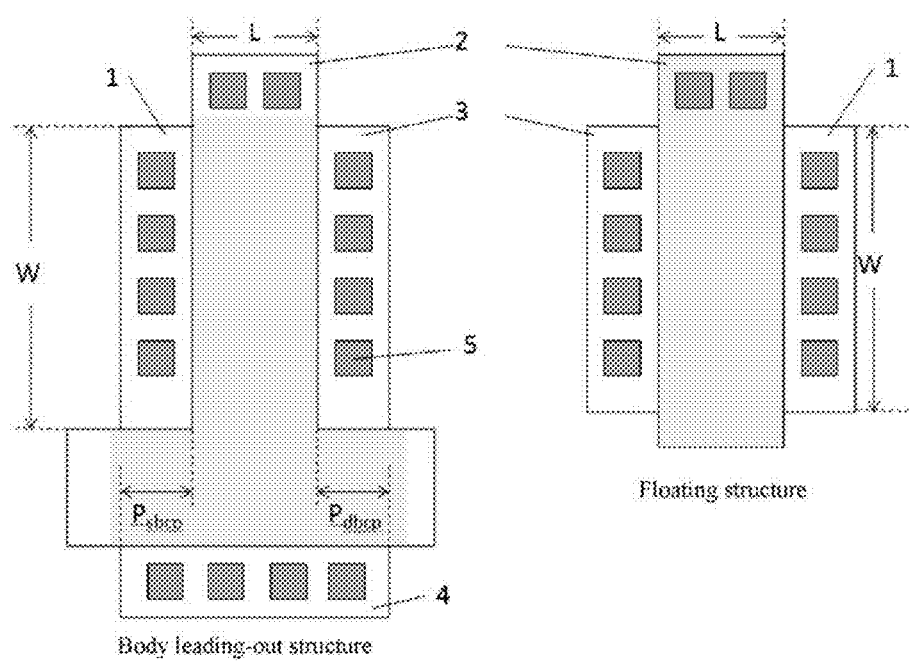
FIG. 1 is a schematic diagram of definitions of relevant sizes of test devices involved in an embodiment.
Figure 2:
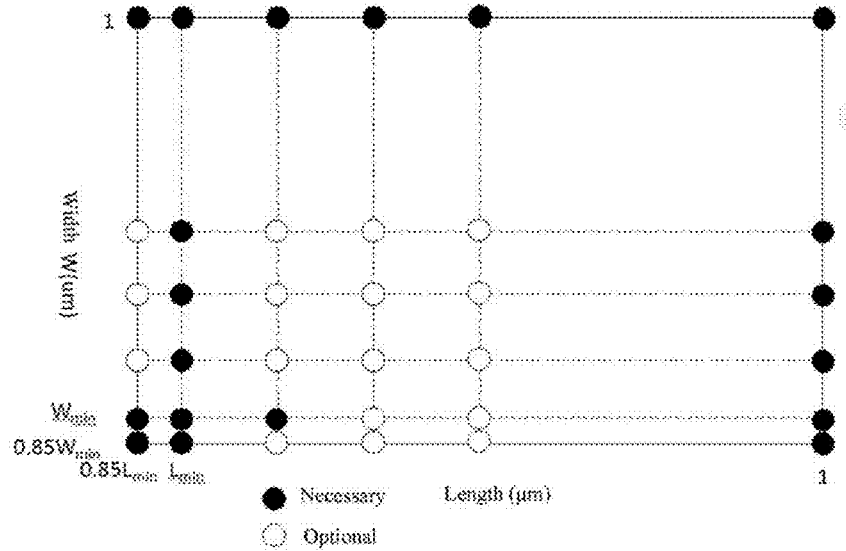
FIG. 2 is a schematic diagram of a range of sizes of test devices involved in the present invention according to an embodiment.

(1) A plurality of MOSFET devices of a body leading-out structure and with different channel lengths L and different channel widths W, and a plurality of MOSFET devices of a floating structure and with different channel lengths L and different channel widths W are provided, where $0.85L_{min} \leq W \leq 1$ μm, $0.85L_{min} \leq L \leq 1$ μm, $W_{min}$ and $L_{min}$ are minimum values determined by a process, and a preferable range of the device sizes is shown in FIG. 2. FIG. 1 shows structures of the MOSFET device of a body leading-out structure and the MOSFET device of a floating structure, where 1 indicates a source, 2 indicates a gate, 3 indicates a drain, 4 indicates a body leading-out part, 5 indicates a contact hole; each kind of the device includes two types: an n-type MOSFET and a p-type MOSFET.

Figure 3:
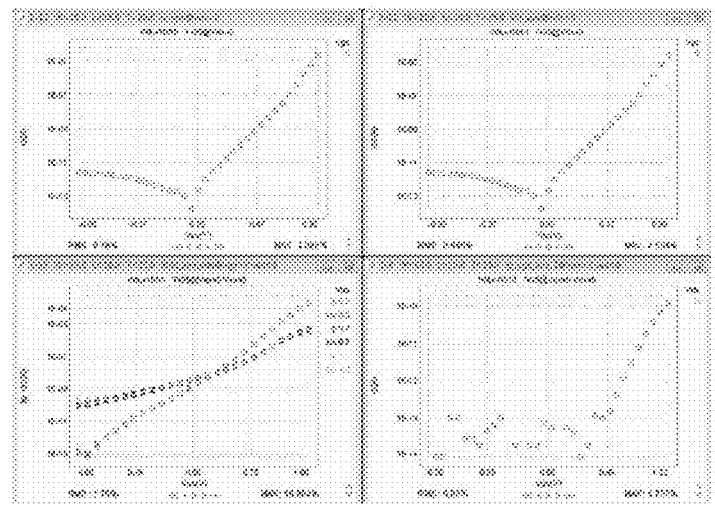
FIG. 3 is a schematic diagram of test data involved in the present invention according to an embodiment.

(2) Electrical property data of all the devices in different temperatures is measured by using a semiconductor parameter measurement instrument (for example, Agilent 4156, Agilent B1500A, Keithley 4200, or the like). Preferably, the electrical property data of all the devices are measured in three different temperatures, where the three different temperatures are a normal temperature, a temperature higher than the normal temperature, and a temperature lower than the normal temperature respectively; and the three temperatures are preferably at 25, 125, and −40 respectively. The test data in this embodiment is shown in FIG. 3.

The measured electrical properties of the MOSFET device of a body leading-out structure include Id-Vg-Vp, Id/Ip-Vd-Vg, Ig-Vg-Vd, Ig-Vp, Ip-Vg-Vd, Is/Id-Vp, and Id/Ip-Vp-Vd properties; and the measured electrical properties of the MOSFET device of a floating structure include Id-Vg-VP, Id-Vd-Vg, and Ig-Vg-Vd properties. The electrical properties are measured through technologies well known by persons skilled in the art, and the details are not described here again. The meaning of each symbol is described in table 1, and preferable specific test data in this embodiment is described in table 2 in detail. Vgg and Vdd are determined by process conditions of the devices.

TABLE 1

| Symbols | Meanings |
| --- | --- |
| Is | Source current |
| Id | Drain current |
| Ig | Gate current |
| Vs | Source voltage |
| Vd | Drain voltage |
| Vg | Gate voltage |
| Ip | Body leading-out current |
| Vp | Body leading-out voltage |
| Vgg | Maximum working voltage of a gate |
| Vdd | Maximum working voltage of a drain |

(3) Heat resistance parameters Rth of all the MOSFET devices of a body leading-out structure and all the MOSFET devices of a floating structure are measured, electrical property curves without a self-heating effect of each MOSFET device of a body leading-out structure and each MOSFET device of a floating structure are obtained according to the electrical property data measured in step (2) and by using software (for example, MBP, BSIMProplus, or the like). The method for measuring the heat resistance parameters Rth and the method for obtaining electrical property curves without a self-heating effect are well known by persons skilled in the art.

The electrical property curves of the MOSFET device of a body leading-out structure include Id-Vg-Vp, Id/Ip-Vd-Vg, Ig-Vg-Vd, Ig-Vp, Ip-Vg-Vd, Is/Id-Vp, and Id/Ip-Vp-Vd curves; and the electrical property curves of the MOSFET device of a floating structure include Id-Vg-VP, Id-Vd-Vg, and Ig-Vg-Vd curves.

(4) DC parameters of a BSIMSOI4 model are extracted successively according to the following sub-steps, where the DC parameters of a BSIMSOI4 model include DC parameters of the MOSFET device of a body leading-out structure and DC parameters of the MOSFET device of a floating structure.

(a) In dedicated software (for example, MBP, BSIM-Proplus, or the like), according to actually applied test devices, process parameters tox, tsi, tbox, nch, and xj, layout parameters nf, nbc, pdbcp, and psbcp, and body contact resistance parameters rbody (several dozen), rbsh (default), and rhalo (default) of each MOSFET device of a body leading-out structure and each MOSFET device of a floating structure are set.

By using the dedicated software, in the bias voltage condition of Vg=0.5 Vgg, Vd=0.1 V, and Vp=0, with W=1 μm and L=$L_{min}$, an Id ratio of the MOSFET device of a body leading-out structure to the MOSFET device of a floating structure in the normal temperature is calculated, the Id ratio is recorded as ratio, and a parameter dwc=(1-ratio)/nbc is obtained.

The parameter dwc is obtained through a fitting method in the prior art, while in the present invention, the parameter dwc is obtained through calculation according to a ratio value obtained through a test result and a layout parameter bbc of an actual device; therefore, the parameter dwc obtained in the

TABLE 2

| Device of a body leading-out structure | | | | | | | | |
| --- | --- | --- | --- | --- | --- | --- | --- | --- |
| Electrical properties | Target current | Scanning voltage V | | | Variable voltage V | | Constant voltage V | |
| Id-Vg-Vp | Id | Vg | −0.5-1.1 Vgg | Vp | −0.3, ..., 0.3 | | Vd | 0.1 |
| | Id | Vg | −0.5-1.1 Vgg | Vp | −0.3, ..., 0.3 | | Vd | Vdd |
| Id/Ip-Vd-Vg | Id/Ip | Vd | 0-1.1 Vdd | Vg | Vth + 0.2, ..., Vgg | | Vp | 0 |
| | Id/Ip | Vd | 0-1.1 Vdd | Vg | Vth + 0.2, ..., Vgg | | Vp | −0.3 |
| Ig-Vg-Vd | Ig | Vg | −0.5-1.1 Vgg | Vd | 0, Vdd | | Vp | 0 |
| Ig-Vp | Ig | Vp | 0-0.7 | Vd | 0 | | Vg | 0 |
| Ip-Vg-Vd | Ip | Vg | −1-1.1 Vgg | Vd | 0, 0.9 Vdd, Vdd, 1.1 Vdd | | Vp | 0 |
| Is/Id-Vp | Is/Id | Vp | −Vdd-0.7 | Vd | 0 | | Vg | 0 |
| Id/Ip-Vp-Vd | Id/Ip | Vp | 0-0.7 | Vd | 0, 0.3, Vdd | | Vg | 0 |
| Device of a floating structure | | | | | | | | |
| Electrical properties | Target current | Scanning voltage | | | Variable voltage | | Constant voltage | |
| Id-Vg-Vp | Id | Vg | −0.5-1.1 Vgg | Vd | 0.1, Vdd | | | |
| Id-Vd-Vg | Id | Vd | 0-1.1 Vdd | Vg | Vth + 0.2, ..., Vgg | | | |
| Ig-Vg-Vd | Ig | Vg | −0.5-1.1 Vgg | Vd | 0, Vdd | | | | present invention is more accurate. The parameter dwc is an important basis parameter in the subsequent steps of extracting other parameters.

(b) According to the electrical property data of the MOSFET device of a body leading-out structure in the normal temperature with W=1 μm and L=1 μm, and by using the dedicated software, all parameters, including vth0, k1, and k2, related to a body effect of the MOSFET device of a body leading-out structure in the BSIMSOI4 model are extracted.

(c) According to an Is/Id-Vp curve of the MOSFET device of a body leading-out structure in the normal temperature with W=1 μm and L=1 μm, and by using the dedicated software, all parameters, including ndiodes, ndioded, jdifs, jdifd, nrecfs, nrecfd, nrecrs, nrecrd, vrecos, vrecod, jrecs, jrecd, ntuns, ntund, vtunos, vtunod, jtuns, and jtund, related to a source body junction and a drain body junction of the MOSFET device of a body leading-out structure in the BSIMSOI4 model are extracted.

(d) According to an Ip/Id-VP-Vd curve of the MOSFET device of a body leading-out structure in the normal temperature with W=1 μm and L=1 μm, and by using the dedicated software, all parameters, including nbjt, lbjt0, jbjts, jbjtd, vabjt, aely, ahlis, and ahlid, related to a parasitic triode of the MOSFET device of a body leading-out structure in the BSIMSOI4 model are extracted; fitting effects of Ip/Id-Vp-Vd curves of all the devices with W=1 μm is optimized by adjusting a parameter ln, so as to determine the parameter ln of the MOSFET device of a body leading-out structure.

(e) According to an Ig-Vp curve and an Ip-Vg curve of the MOSFET device of a body leading-out structure in the normal temperature with W=1 μm and L=1 μm, and by using the dedicated software, all parameters, including α gbl, β gbl, vevb, vgbl, α gb2, β gb2, vecb, and vgb2, related to a gate-to-body current of the MOSFET device of a body leading-out structure in the BSIMSOI4 model are extracted.

(f) According to an Ip-Vg-Vd curve of the MOSFET device of a body leading-out structure in the normal temperature with W=1 μm and L=1 μm, and by using the dedicated software, all parameters, including agidl, agis1, bgidl, bgisl, cgidl, cgisl, egidl, and egisl, related to a gate-induced drain leakage (GIDL) current of the MOSFET device of a body leading-out structure in the BSIMSOI4 model are extracted.

(g) According to test data of the MOSFET devices of a body leading-out structure and of all the sizes in the normal temperature, and by using the dedicated software, all parameters, including relevant parameters of a sub-threshold region, a linear region, and a saturation region, and transconductance and output impedance, related to a drain current Id and a gate current Ig of the MOSFET device of a body leading-out structure in the BSIMSOI4 model are extracted.

(h) According to an Ip-Vg-Vd curve and an Ip-Vd-Vg curve of the MOSFET device of a body leading-out structure with W=1 μm and L=1 μm, and by using the dedicated software, all parameters, including α0, β0, β1, β2, fbjtii, vdsatii0, sii0, sii1, sii2, and siid, related to a collision ionization current of the MOSFET device of a body leading-out structure in the BSIMSOI4 model are extracted; fitting effects of Ip-Vg-Vd curves and Ip-Vd-Vg curves of all the devices with W=1 μm are optimized by adjusting parameters 1ii and esatii, so as to determine the parameters 1ii and esatii of the MOSFET device of a body leading-out structure.

(i) Through the electrical property data in other two temperatures (125 and −40), and by using the dedicated software, all temperature-related parameters related to a threshold voltage, mobility, a series resistance, saturation velocity, a junction current, a parasitic triode, and a collision ionization current of the MOSFET device of a body leading-out structure in the BSIMSOI4 model are extracted, so as to obtain all DC parameters of the MOSFET device of a body leading-out structure in the BSIMSOI4 model.

(j) First, all the extracted DC parameters of the MOSFET device of a body leading-out structure are applied to an MOSFET device model of a floating structure, then parameters nbc, pdbcp, and psbcp are set to zero, all of parameters (including k1, k2, dvt2, k3b, cdscb, keta, uc, prwb, pdib1cb, cgid1, and cgis1) related to a body bias voltage and the parameters related to the gate-to-drain current, the gate-to-body current, the junction current, and the parasitic triode are kept unchanged, other DC parameters of the MOSFET device of a floating structure in the BSIMSOI4 model are finely adjusted, and fitting effects of electrical property curves without a self-heating effect of the MOSFET device of a floating structure is optimized, so as to determine all DC parameters of the MOSFET device of a floating structure in the BSIMSOI4 model.

In the foregoing sub-steps, the method for extracting the required parameters according to the test data or the test curves and by using the dedicated software is known in the art, and the details are not described here again. The used test curves are the electrical property curves without a self-heating effect that are obtained in step (3), and the model parameters extracted through the curves without self-heating can more fit in with actual conditions of the devices. Since the model parameters are associated with one another, and the model parameters determined in each step have a certain influence on the model parameters to be determined in a next step, the foregoing steps are successively executed, and the DC parameters successively determined according to the specific order can more accurately characterize the actual conditions of the devices.

In the present invention, in the condition of different temperatures and different bias voltages, electrical performance of SOI MOSFET devices of various sizes is tested, test conditions are optimized, and then according to a specific order, proper test curves are selected according to model equations, and various parameters are successively extracted. All DC parameters of the MOSFET of a body leading-out structure in a BSIMSOI4 model are first obtained through steps (a) to (i), and then fitting and fine adjustment are performed in step (j) according to the obtained DC parameters of the MOSFET of a body leading-out structure, to determined all DC parameters of the MOSFET device of a floating structure, and finally, all required DC parameters of the BSIMSOI4 model are obtained. Through the method, a more accurate and reliable device model can be obtained.

All the DC parameters of the BSIMSOI4 model that are mentioned in the description may be found in a BSIMSOI4 model parameter standard, and are well known by persons skilled in the art, and the details are not described here again.

The foregoing embodiment is used to illustrate, but is not intended to limit, the technical solutions of the present invention. Any technical solution without departing from the spirit and scope of the present invention shall be covered in the patent claims of the present invention.

What is claimed is:
1. A method for determining BSIMSOI4 Direct Current (DC) model parameters, comprising the following steps:
   (1) providing a plurality of Metal Oxide Semiconductor Field Effect Transistor (MOSFET) devices of a body leading-out structure and with different channel lengths L and different channel widths W; and providing a plurality of MOSFET devices of a floating structure and with different channel lengths L and different channel widths W, wherein 0.85Wmin≤W≤1 μm, 0.85$L_{min}$≤L≤1 μm, and $W_{min}$ and $L_{min}$ are minimum values determined by a process;

(2) measuring electrical property data of all the MOSFET devices of a body leading-out structure and all the MOSFET devices of a floating structure in different temperatures by using a semiconductor parameter measurement instrument, wherein the measured electrical property curves of the MOSFET devices of a body leading-out structure comprise: Id-Vg-Vp, Id-Vd-Vg, Ip-Vd-Vg, Ig-Vg-Vd, Ig-Vp, Ip-Vg-Vd, Is-Vp, Id-Vp, Id-Vp-Vd and Ip-Vp-Vd property curves; and the measured electrical properties of the MOSFET devices of a floating structure comprise: Id-Vg-Vp, Id-Vd-Vg, and Ig-Vg-Vd property curves;

(3) measuring heat resistance parameters Rth of all the MOSFET devices of a body leading-out structure and all the MOSFET devices of a floating structure; and obtaining, according to the electrical property data measured in step (2), electrical property curves without a self-heating effect of each MOSFET device of a body leading-out structure and each MOSFET device of a floating structure, wherein the electrical property curves without a self-heating effect of the MOSFET device of a body leading-out structure comprise: Id-Vg-Vp, Id-Vd-Vg, Ip-Vd-Vg, Ig-Vg-Vd, Ig-Vp, Ip-Vg-Vd, Is-Vp, Id-Vp, Id-Vp-Vd and Ip-Vp-Vd curves, and the electrical property curves without a self-heating effect of the MOSFET device of a floating structure comprise Id-Vg-Vp, Id-Vd-Vg, and Ig-Vg-Vd curves;

(4) extracting, successively according to the following substeps, DC parameters of the MOSFET devices of a body leading-out structure and DC parameters of the MOSFET devices of a floating structure in a BSIMSOI4 model:

(a)
In dedicated software, according to actually applied test devices, process parameters tox, tsi, tbox, nch, and xj, layout parameters nf, nbc, pdbcp, and psbcp, and body contact resistance parametrs rbody, rbsh, and rhalo of each MOSFET device of a body leading-out structure and each MOSFET device of a floating structure are set;
By using the dedicated software, in the bias voltage condition of Vg=0.5 Vgg, Vd=0.1 V, and Vp=0, with W=1 μm and L=$L_{min}$, an Id ratio of the MOSFET device of a body leading-out structure to the MOSFET device of a floating structure in the normal temperature is calculated, the Id ratio is recorded as ratio, and a parameter dwc=(1-ratio)/nbc is obtained;
wherein Id refers to drain current, nbc is a layout parameter of the device, and the dedicated software refers to MBP or BSIMProplus;

(b) according to the electrical property data of the MOSFET device of a body leading-out structure with W=1 μm and L=1 μm, extracting parameters related to a body effect of the MOSFET device of a body leading-out structure in the BSIMSOI4 model, wherein the parameters refer vth0, k1, k2;

(c) according to Is-Vp and Id-Vp curves of the MOSFET device of a body leading-out structure with W=1 μm and L=1 μm, extracting parameters related to a source body junction and a drain body junction of the MOSFET device of a body leading-out structure in the BSIMSOI4 model, wherein the parameters refer to ndiodes, ndioded, jdifs, jdifd, nrecfs, nrecfd, nrecrs, nrecrd, vrec0s, vrec0d, jrecs, jrecd, ntuns, ntund, vtun0s, vtun0d, jtuns, jtund;

(d) according to Ip-Vp-Vd and Id-Vp-Vd curves of the MOSFET device of a body leading-out structure with W=1 μm and L=1 μm, extracting parameters related to a parasitic triode of the MOSFET device of a body leading-out structure in the BSIMSOI4 model, wherein the parameters refer to nbjt, lbjt0, jbjts, jbjtd, vabjt, aely, ahlis, ahlid; optimizing, by adjusting a parameter ln, fitting effects of Ip-Vp-Vd and Id-Vp-Vd curves of all the MOSFET devices of a body leading-out structure with W=1 μm, so as to determine the parameter ln of the MOSFET device of a body leading-out structure, wherein the parameter ln refers to the carrier diffusion lenth;

(e) according to an Ig-Vp curve and an Ip-Vg-Vd curve of the MOSFET device of a body leading-out structure with W=1 μm and L=1 μm, extracting parameters related to a gate-to-body current of the MOSFET device of a body leading-out structure in the BSIMSOI4 model, wherein the parameters refer to αgb1, βgb1, vevb, vgb1, αgb2, βgb2, vecb, vgb2;

(f) according to an Ip-Vg-Vd curve of the MOSFET device of a body leading-out structure with W=1 μm and L=1 μm, extracting parameters related to a gate-induced drain leakage current of the MOSFET device of a body leading-out structure in the BSIMSOI4 model, wherein the parameters refer to agidl, agisl, bgidl, bgisl, cgidl, cgsil, egidl, egisl;

(g) according to the electrical property data of the MOSFET devices of a body leading-out structure and of all sizes, extracting parameters related to a drain current Id and a gate current Ig of the MOSFET devices of a body leading-out structure in the BSIMSOI4 model;

(h) according to an Ip-Vg-Vd curve and an Ip-Vd-Vg curve of the MOSFET device of a body leading-out structure with W=1 μm and L=1 μm, extracting parameters related to a collision ionization current of the MOSFET device of a body leading-out structure in the BSIMSOI4 model, wherein the parameters refer to α0, β0, β1, β2, fbjtii, vdsatii0, sii0, sii1, sii2, siid; optimizing, by adjusting parameters 1ii and esatii, fitting effects of Ip-Vg-Vd curves and Ip-Vd-Vg curves of all the MOSFET devices of a body leading-out structure with W=1 μm, so as to determine the parameters 1ii and esatii of the MOSFET device of a body leading-out structure, wherein the parameter 1ii refers to the collision ionization length coefficient, and the parameter esatii refers to the collision ionization saturation electric field;

(i) extracting temperature-related parameters related to a threshold voltage, mobility, a series resistance, saturation velocity, a junction current, a parasitic triode, and a collision ionization current of the MOSFET device of a body leading-out structure in the BSIMSOI4 model, so as to obtain all DC parameters of the MOSFET device of a body leading-out structure in the BSIMSOI4 model; and (j) first applying all the extracted DC parameters of the MOSFET device of a body leading-out structure to the MOSFET device model of a floating structure, then setting nbc, pdbcp, and psbcp to zero, keeping all of parameters related to a body bias voltage and parameters related to the gate-induced drain leakage current, the gate-to-body current, the junction current, and the parasitic triode unchanged, finely adjusting other DC parameters of the MOSFET device of a floating structure in the BSIMSOI4 model, and optimizing fitting effects of electrical property curves without a self-heating effect of the MOSFET device of a floating structure, so as to determine all DC parameters of the MOSFET device of a floating structure in the BSIMSOI4 model, wherein the parameters related to a body bias voltage refer to k1, k2, dvt2, k3b, cdscb, keta, uc, prwb, pdiblcb, cgidl, cgisl.

2. The method for determining BSIMSOI4 DC model parameters as in claim 1, wherein in step (2), when the Ip-Vg-Vd property of the MOSFET device of a body leading-out structure is measured, a value of a scanning voltage ranges from 0 V to 1.1 Vgg, and Vdd is a maximum working voltage of a drain.

3. The method for determining BSIMSOI4 DC model parameters as in claim 1, wherein in step (2), when the Ip-Vg-Vd property of the MOSFET device of a body leading-out structure is measured, a value of a scanning voltage ranges from −1 V to 1.1 Vgg, a value of a variable voltage is 0 V, 0.9 Vdd, Vdd, or 1.1 Vdd, Vgg is a maximum working voltage of a gate, and Vdd is a maximum working voltage of a drain.

4. The method for determining BSIMSOI4 DC model parameters as in claim 1, wherein in step (2), when the Id-Vp-Vd and Ip-Vp-Vd property curves of the MOSFET device of a body leading-out structure is measured, a value of a scanning voltage ranges from 0 V to 0.7 V, a value of a variable voltage is 0 V, 0.3 V, or Vdd, and Vdd is a maximum working voltage of a drain.

5. The method for determining BSIMSOI4 DC model parameters as in claim 1, wherein in step (2), the electrical property data of all the devices is measured in three different temperatures, and the three different temperatures are a normal temperature, a temperature higher than the normal temperature, and a temperature lower than the normal temperature respectively.

6. The method for determining BSIMSOI4 DC model parameters as in claim 5, wherein in the sub-steps (a) to (h) in step (4), the parameters are extracted by using the electrical property data in the normal temperature; in step (i), the parameters are extracted by using the electrical property data in the temperature higher than the normal temperature and the temperature lower than the normal temperature.

\* \* \* \* \*